(12) United States Patent
Wirth et al.

(10) Patent No.: US 6,806,194 B2
(45) Date of Patent: Oct. 19, 2004

(54) APPARATUS AND METHODS FOR PROCESSING A WORKPIECE

(75) Inventors: Paul Z. Wirth, Whitefish, MT (US); Steven L. Peace, Whitefish, MT (US); Erik Lund, Kent, WA (US)

(73) Assignee: Semitool. Inc., Kalispell, MT (US)

( * ) Notice: Subject to any disclaimer, the term of this patent is extended or adjusted under 35 U.S.C. 154(b) by 0 days.

(21) Appl. No.: 10/412,944

(22) Filed: Apr. 14, 2003

(65) Prior Publication Data

US 2003/0176067 A1 Sep. 18, 2003

Related U.S. Application Data

(63) Continuation of application No. 09/907,484, filed on Jul. 16, 2001, now Pat. No. 6,548,411, which is a continuation-in-part of application No. 09/437,711, filed on Nov. 10, 1999, now Pat. No. 6,423,642, which is a continuation-in-part of application No. PCT/US99/05676, filed on Mar. 15, 1999.
(60) Provisional application No. 60/116,750, filed on Jan. 22, 1999.

(51) Int. Cl.[7] ............................................. H01L 21/311
(52) U.S. Cl. ...................... 438/694; 438/906; 438/913; 438/780; 438/782; 438/758; 134/153; 134/157; 134/199; 134/902; 118/723; 156/345
(58) Field of Search ........................ 438/694, 906–913, 438/780–182, 758; 134/153–157, 199, 902; 156/345; 118/723

(56) References Cited

U.S. PATENT DOCUMENTS 4,559,718 A * 12/1985 Tadokoro ...................... 34/317
4,750,505 A * 6/1988 Inuta et al. .................. 134/153
5,551,986 A * 9/1996 Jain .............................. 134/6
5,584,310 A * 12/1996 Bergman et al. ........... 134/95.1
5,762,708 A * 6/1998 Motoda et al. ............... 118/52
6,149,729 A * 11/2000 Iwata et al. .................. 118/715
6,350,319 B1 * 2/2002 Curtis et al. ................. 118/715
6,423,642 B1 * 7/2002 Peace et al. ................. 438/694
6,548,411 B2 * 4/2003 Wirth et al. ................. 438/694

* cited by examiner

*Primary Examiner*—Matthew Smith
*Assistant Examiner*—Granvill D. Lee
(74) *Attorney, Agent, or Firm*—Perkins Coie, LLP (57) ABSTRACT

A system for processing a workpiece includes a head attached to a head lifter. A workpiece is supported in the head between an upper rotor and a lower rotor. A base has a bowl for containing a liquid. The head is movable by the head lifter from a first position vertically above the bowl, to a second position where the workpiece is at least partially positioned in the bowl. The bowl has a contour section with a sidewall having a radius of curvature which increases adjacent to a drain outlet in the bowl, to help rapid draining of liquid from the bowl. The head has a load position, where the rotors are spaced apart by a first amount, and a process position, where the rotors are engaged and sealed against each other. For rapid evacuation of fluid, the head also has a fast drain position, where the rotors are moved apart sufficiently to create an annular drain gap. Fluid is rapid evacuated by spinning the rotors with the head rotors slightly apart and unsealed, causing the fluid to flow our quickly under centrifugal force.

14 Claims, 9 Drawing Sheets

APPARATUS AND METHODS FOR PROCESSING A WORKPIECE

This application is a Continuation of: U.S. patent application Ser. No. 09/907,484 filed Jul. 16, 2001 and now U.S. Pat. No. 6,548,411, which is a Continuation-In-Part of U.S. patent application Ser. No. 09/437,711, filed Nov. 10, 1999 and now U.S. Pat. No. 6,423,642, which is a Continuation-In-Part/U.S. National Phase of International patent application No. PCT/US99/05676, filed Mar. 15, 1999, designating the U.S. and published in English which claims priority to U.S. Patent Application Ser. No. 60/116,750 filed Jan. 22, 1999. Priority to these Applications is claimed and these Applications are incorporated herein by reference. This Application also incorporates by reference U.S. patent application Ser. Nos. 09/907,522, 09/907,524, and 09/907,552, all filed on Jul. 16, 2001.

The invention relates to surface preparation, cleaning, rinsing and drying of workpieces, such as semiconductor wafers, flat panel displays, rigid disk or optical media, thin film heads, or other workpieces formed from a substrate on which microelectronic circuits, data storage elements or layers, or micro-mechanical elements may be formed. These and similar articles are collectively referred to here as a "wafer" or "workpiece".

BACKGROUND OF THE INVENTION

The semiconductor manufacturing industry is constantly seeking to improve the processes used to manufacture microelectronic circuits and components, such as the manufacture of integrated circuits from wafers. The objectives of many of these improved processes are decreasing the amount of time required to process a wafer to form the desired integrated circuits; increasing the yield of usable integrated circuits per wafer by, for example, decreasing contamination of the wafer during processing; reducing the number of steps required to create the desired integrated circuits; and reducing the costs of manufacture.

In the processing of wafers, it is often necessary to subject one or more sides of the wafer to a fluid in either liquid, vapor or gaseous form. Such fluids are used to, for example, etch the wafer surface, clean the wafer surface, dry the wafer surface, passivate the wafer surface, deposit films on the wafer surface, etc. Controlling how the processing fluids are applied to the wafer surfaces, is often important to the success of the processing operations.

Various machines and methods have been used for carrying out these manufacturing processes. However, existing machines have several disadvantages. These disadvantages include relatively large consumption of process chemicals and water. This consumption of process chemicals increases manufacturing costs, which ultimately increases the cost of the final product, such as e.g., computers, cell phones, and virtually all types of consumer, industrial, commercial and military electronic products. In addition, many process chemicals are toxic and require special handling, storage, and disposal methods. These can be costly and difficult, but are necessary for health, safety and environmental reasons. Consequently, reducing consumption of process chemicals has many advantages.

Reducing consumption of water is also beneficial. In many areas, water is becoming increasingly scarce. Due to population growth, there is greater competition for water. Disposing of waste water in environmentally friendly ways has also often become more difficult or costly. Accordingly, reducing water consumption in the manufacturing process is also important.

In many process manufacturing steps, the process chemicals used should be applied evenly onto the wafers, to avoid having too much or too little etching, film removal, etc. Existing machines often are not able to sufficiently uniformly apply process chemicals. This can result in lower yields. Moreover, many existing machines try to compensate for variations in applying process chemicals by using larger amounts of process chemicals. This inefficient use of process chemicals leads to the disadvantages described above.

In general, it is advantageous to rapidly remove a process fluid from a process chamber, so that a next step may be performed without delay. Fast draining or removing of a process liquid speeds up the manufacturing sequence. In many process machines, removing used liquid at the end of a process step can be a relatively time consuming step. Typically, the liquid must be drained out of one or more drain openings which are limited in size to achieve desired liquid flow or containment characteristics during processing. While waiting for the liquid to drain or be removed, the process machine, or potentially even a larger system having the process machine as one of several machines, is inactive. Consequently, processing is slowed due to the wait time for removing fluid.

Accordingly, improved machines and methods which provide improved yield, consume less process chemicals and water, and offer better results in performing manufacturing operations, are needed.

SUMMARY OF THE INVENTION

In a first aspect, a process head for holding a workpiece is supported on a head lifter or elevator. The process head is brought into engagement with a base having a bowl for holding a bath of liquid. A drain is provided at a perimeter of the bowl. The bowl advantageously has a substantially uniform radius, except at a contour section where the radius increases as it approaches the bowl outlet or drain. The contour section minimizes retention of liquid within the bowl, providing for faster and more effective draining or removal of liquid from the bowl. This allows for faster manufacturing as well as reducing potential for loss of workpieces due to contamination.

In a second aspect, a single drain opening is provided at the perimeter of the bowl. A valve manifold block connected to the drain outlet is switchable to direct liquid flowing out of the bowl drain to selected collection, re-circulation or waste line locations. Gas spray nozzles may be associated with the drain to assist in moving liquid out of the drain. These features allow for faster manufacturing as liquid can be removed more quickly. It may also reduce consumption of water and process chemicals by allowing recirculation with less unintended mixing of fluids used in sequential process steps.

In a third aspect, a process apparatus has a process head having a load/unload position, a process position, and also a fast drain position. The apparatus preferably includes a lower rotor which rotates with an upper rotor and a workpiece. In the load position, the upper and lower rotors are spaced apart. In the process position, the upper and lower rotors are brought together and contact and preferably also seal adjacent to their outer edges. In the fast drain position, the upper and lower rotors are moved apart slightly, to create a circumferential opening between them. With the rotors and workpiece spinning, fluids on or around the workpiece are quickly centrifugally removed. As the circumferential opening is large in comparison to the drain openings which may be used in one or both rotors, draining or fluid removal is very fast, and even up to 10 or more times faster than in the machines currently in use. These features allow for faster processing of workpieces.

Accordingly, it is an object of the invention to provide improved methods and apparatus for processing a workpiece. The invention resides as well in subcombinations of the steps and features described. The features described and illustrated in connection with one embodiment may or course be used in other embodiments as well.

BRIEF DESCRIPTION OF THE DRAWINGS

In the drawings, the same element number indicates the same element in all of the views.

DETAILED DESCRIPTION OF THE DRAWINGS

Figure 1:
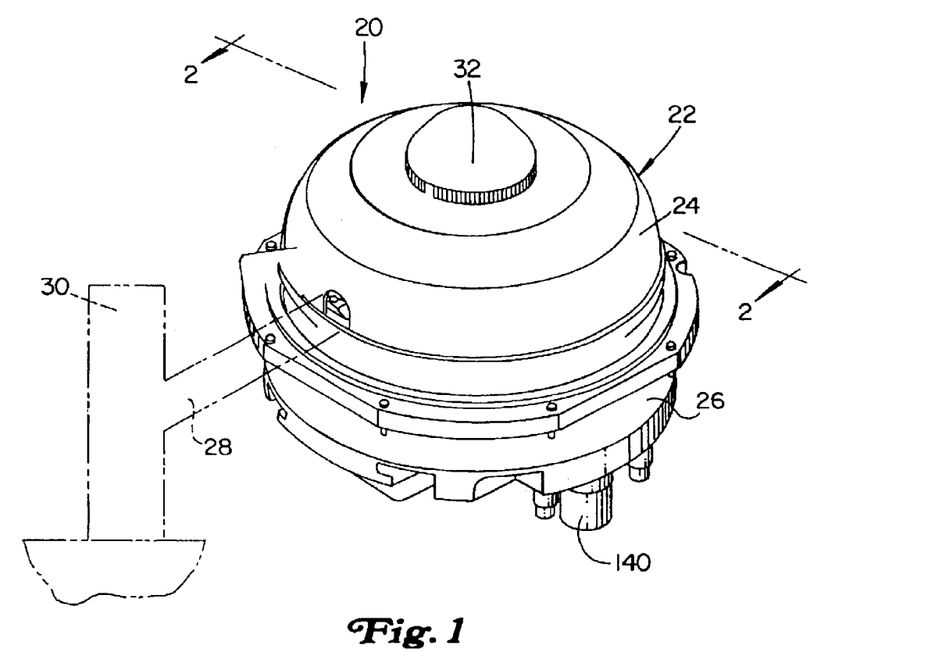
FIG. 1 is a perspective view of a reactor for use in a processing system.

As shown in FIG. 1, a reactor 22 has a process head 24 vertically moveable to engage a base 26. The process head 24 is supported on a support arm 28, which is raised and lowered by an elevator 30. A cover 32 encloses the internal components of the head 24. The reactor 22 may be included in a system 20 having several reactors in a linear or circular array, and with workpieces moved to and from the reactors by a system robot.

The process head 24 has subassemblies which in combination allow a workpiece 100 to be securely held within the head 24, to be rotated in the head 24, and to be loaded into and unloaded from the head 24. In addition, the head 24 includes components for subassemblies which allow process fluids to be introduced on to and distributed over the surfaces of the workpiece 100. The head 24 has components or subassemblies which move rotors contacting the workpiece 100 into a load/unload position, a process position, and a fast drain position.

Figure 2:
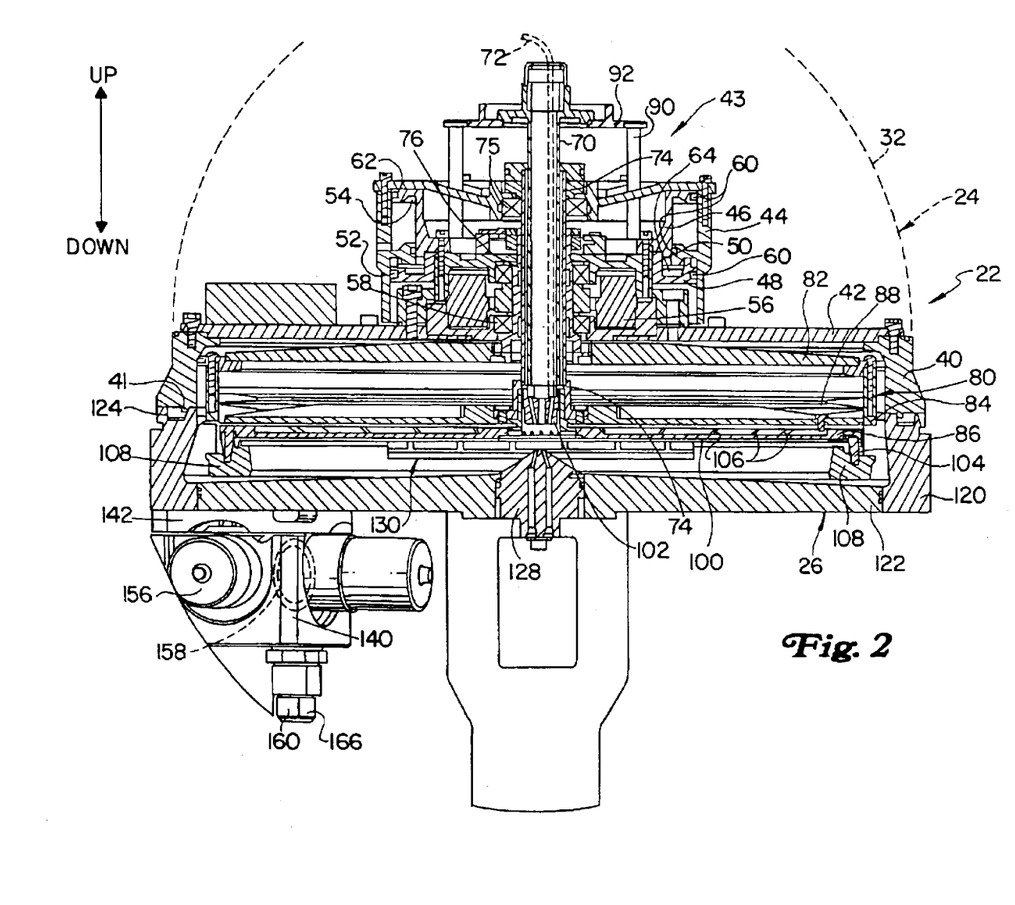
FIG. 2 is a partial section view taken along line 2—2 of FIG. 1.

The workpiece 100 is held between an upper rotor assembly 80 and a lower rotor 108. The upper rotor assembly includes a face plate 94 which faces the top surface of the workpiece 100. The face plate 94 is attached to a bottom plate 86. The face plate 94 is preferably Teflon fluorine resin or PVDF or another non-reactive plastic material. The bottom plate 86 is preferably aluminum, to provide stiffness and strength. A Teflon sheet 87 shields the bottom plate from the process chemicals introduced into the chamber 114 or the bowl 126 in the base 26. The face plate 94 and bottom plate 86 are axially or vertically moveable relative to a top plate 82, within an upper rotor ring 84. A bellows 88 is attached around the perimeter of the top plate 82 and the bottom plate 86, to prevent or reduce exposure of internal head components to process fluids. The lower rotor 108 is supported on and rotates with the upper rotor ring 84.

The upper rotor assembly 80 is vertically or axially moveable relative to the ring plate 42 and other structure and components of the head 24. The lower rotor 108 is rotatable with the upper rotor assembly 80, but is otherwise vertically fixed in position in the head 24. Referring to FIG. 2, a motor 56 spins an inner shaft 74 attached to the upper rotor assembly 80, specifically to the bottom plate 86. An outer shaft 76 surrounding the inner shaft 74 spins the top plate 82, and correspondingly, the upper rotor ring 84, and the lower rotor 108 supported by the upper rotor ring 84. A shift assembly 43 shifts the upper rotor assembly 80 between three alternative positions shown in FIGS. 7–9. The upper rotor shift assembly 43 shifts the upper rotor assembly 80 by acting on the inner shaft 74.

The upper rotor shift assembly 43 includes an inner cylinder 46 and a cylinder base 48 within an outer cylinder 44. A piston ring 50 extends radially inwardly from the outer cylinder 44 and seals against the inner cylinder 46. Sliding seals 60 allow the outer cylinder to shift vertically relative to the inner cylinder 46 and cylinder base 48, to raise and lower the upper rotor assembly 80 within the head 24.

Referring still to FIG. 2, a lower cylinder inlet 52 is connected to a compressed gas source and is positioned to introduce compressed gas in the space between the piston ring 50 and the cylinder base 48, driving the outer cylinder up. Correspondingly, an upper cylinder inlet 54 is connected to a compressed gas source and is positioned to introduce compressed gas into the space between the inner cylinder 46 and the piston ring 50, driving the outer cylinder 44 down.

The outer shaft 76 is supported on bearings 58. A cylinder top plate 62 is attached to the top end of the outer cylinder 44. A thrust bearing 75 exerts axial force, up or down, on the inner shaft 74, while allowing the inner shaft 74 to rotate while the cylinder top plate 62 and outer cylinder 44 remain in place (shiftable vertically but not rotatable).

Fluid delivery lines 72 preferably extend down through the upper inlet tube 70 within the inner shaft 74, to provide process fluids to an upper nozzle 102 in the upper rotor assembly 80. Guide rods 90 extend up from the inner cylinder 46 and support a cap 92 around the upper inlet tube 70. The guide rods 90 pass through clearance holes in the cylinder top plate 62.

Figure 4:
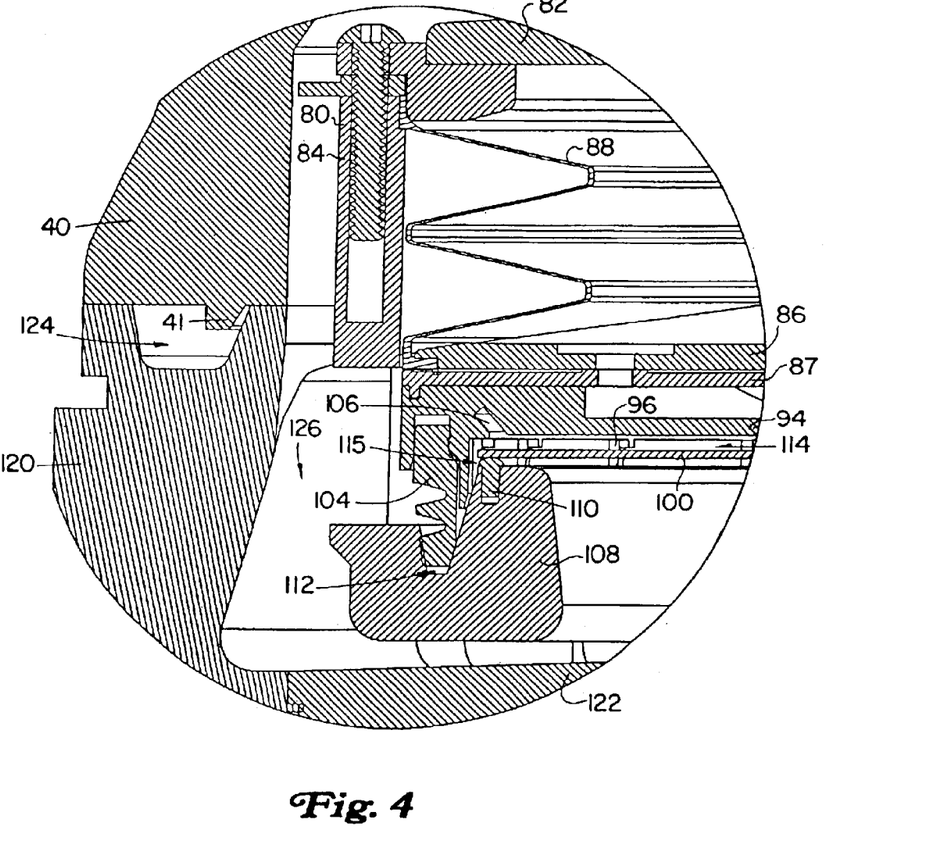
FIG. 4 is an enlarged section view detail better illustrating features shown in FIG. 2.

Referring momentarily to FIG. 4, with the reactor 22 in the process position (shown in FIG. 8), the workpiece 100 is secured between support pins 110 on the lower rotor 108, and pins or standoffs 96 on the face plate 94 of the upper rotor assembly 80. A rotor seal 104 on the face plate 94 engages into a seal groove 112 in the lower rotor 108. As a result, fluids introduced into the upper face chamber 114 formed between the top surface of the workpiece 100 and the face plate 94, can move out of the chamber 114 only through upper rotor outlets 106, when the reactor 22 is in the process position.

As certain process fluids are highly corrosive or reactive, the components coming into contact with the process fluids, such as the lower rotor 108, seal 104 and face plate 94 are preferably made of a material, such as Teflon fluorine containing resins, having minimal or no potential to corrode or react with the process fluids.

Figure 3:
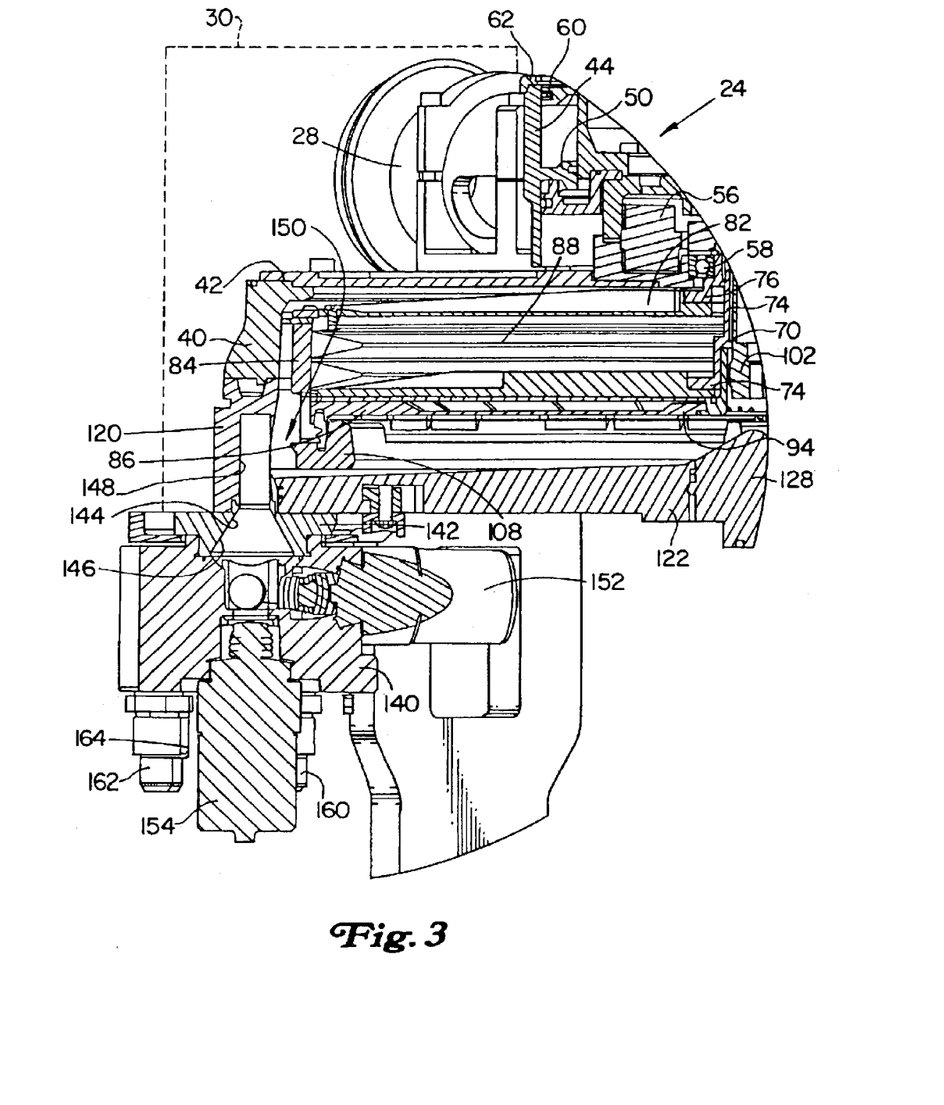
FIG. 3 is an enlarged partial section view of the reactor shown in FIGS. 1 and 2.

Referring to FIGS. 2 and 3, the base 26 includes an annular base ring 120 attached around a base plate 122. The ring lip 41 on the head ring 40 engages a groove 124 on the top surface of the base ring 120. The base ring 120 and base plate 122 form a bowl or vessel 126 for holding a liquid. A lower nozzle 128 preferably is located at a central position within a bowl 126, to introduce fluid on to a central location of the bottom surface of the workpiece 100.

The load slot 130 is provided through one side of the annular upper rotor ring 84, to facilitate loading and unloading of a workpiece 100 into the head 24 via a robot and effector.

As shown in FIG. 3, the drain opening 150 has a cylindrical bore section 148 opening into the bowl 126. A conical or flare section 144 is positioned below the bore section 148, in an outlet block 142 positioned below the base ring 120 and base plate 122. Gas outlets or nozzles 146 are provided in the flare section 144. A compressed gas source provides a gas, such as nitrogen or air, to the gas nozzles 146. A manifold block 140 positioned under the outlet block 142 has a first valve 152, a second valve 154, and third valve 156, and a fourth valve 158. A first drain fitting 160, a second drain fitting 162, a third drain fitting 164, and a fourth drain fitting 168 extend into the manifold block 140, and are associated, respectively, with the first, second, third and fourth valves.

Figures 5, 6:
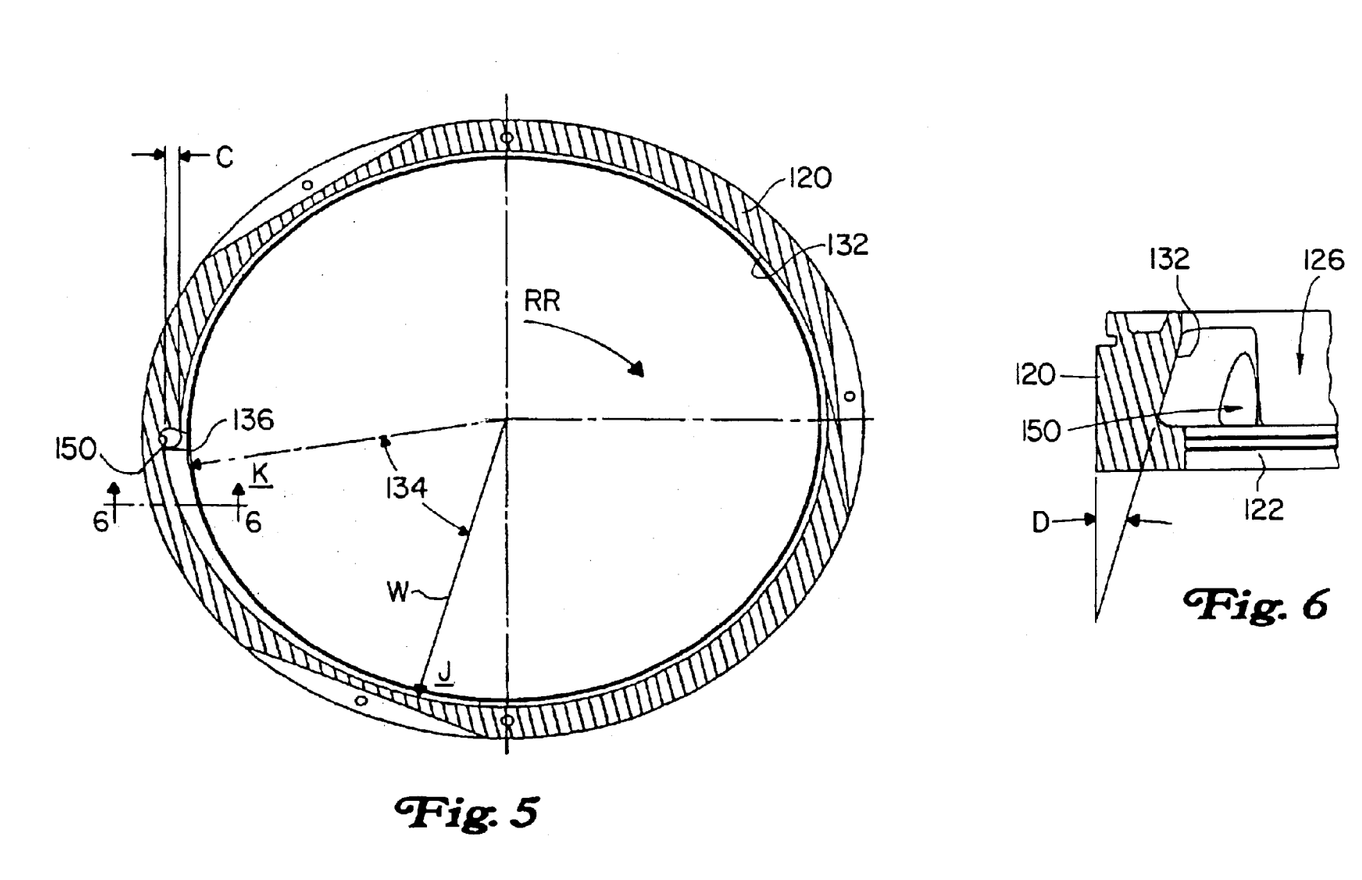
FIG. 5 is a plan view of the base ring shown in FIG. 2.
FIG. 6 is a section view taken along line 6—6 of FIG. 5.

Referring to FIG. 5, the base ring 120 has a bowl sidewall 132 which is preferably inclined inwardly at an angle D of from 5–45 or 10–20 or 30, or 15–20 or 30 degrees. The sidewall 132 has a uniform radius of curvature, except at a contour section 134 leading up to the outlet opening 150. In the contour section 134, the radius of curvature of the sidewall 132 gradually increases from position J (at about the 6 or 7 o'clock position in FIG. 5) to position K just before the outlet 150 (at about the 9 o'clock position in FIG. 5). The sidewall 132 curves back inwardly at a drain opening radius 136 immediately before the drain opening 150. The radius of the bowl sidewall 132 increases in the contour section by about from 2–25%, preferably by about 5–15% and including every whole number integer percent between 2 and 25%, as if each such whole number integer (2, 3, 4 . . . 23, 24, 25) were individually set forth herein. In the embodiment shown, radius W is about 180 mm, and is selected based on the size of the workpiece 100 to be accommodated in the bowl 126. The drain opening radius 136 has a radius of about 10 mm. While the contour section 134 in FIG. 5 subtends an arc of about 70 degrees, the contour section 134 may range from 10–360 degrees, preferably 20–180 degrees, or 45–120 degrees, and more preferably 50 or 60–100 or 110 degrees. The drain opening 150, or the drain opening radius 136 designates the end of the contour section 134. The beginning of the contour section (relative to the direction of rotation of the workpiece) is where the radius W begins to increase.

Figure 7:
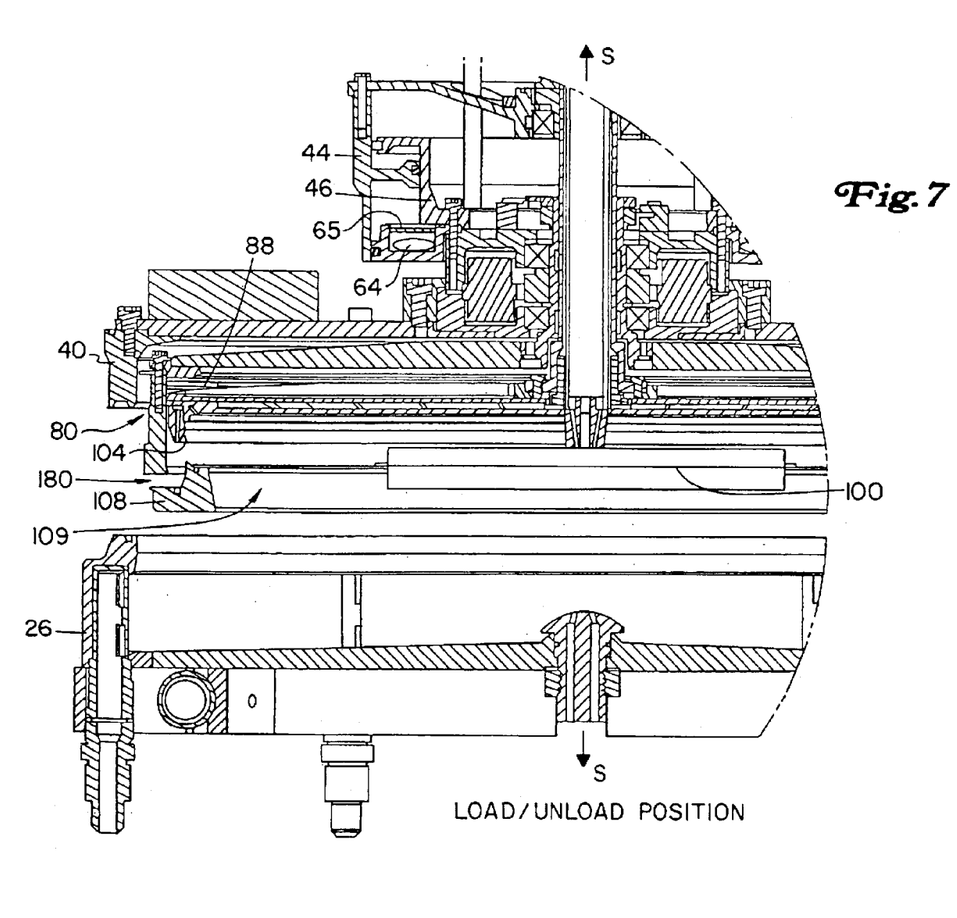
FIG. 7 is a partial section view of the reactor shown in FIG. 2, in a load/unload position.

In use, the head 24 is initially in the load/unload position shown in FIG. 7. A workpiece 100 is loaded into the head, typically by a robot. The workpiece is moved laterally or horizontally into the head, between the lower rotor 108 and the face plate 100. The workpiece is then moved down slightly and comes to rest on the support pins 110 on the lower rotor 108. Centering pins may be provided on the lower rotor, just outside of the circumferential edges of the workpiece 100, to maintain the workpiece centered on the spin axis S of the rotors.

Figure 8:
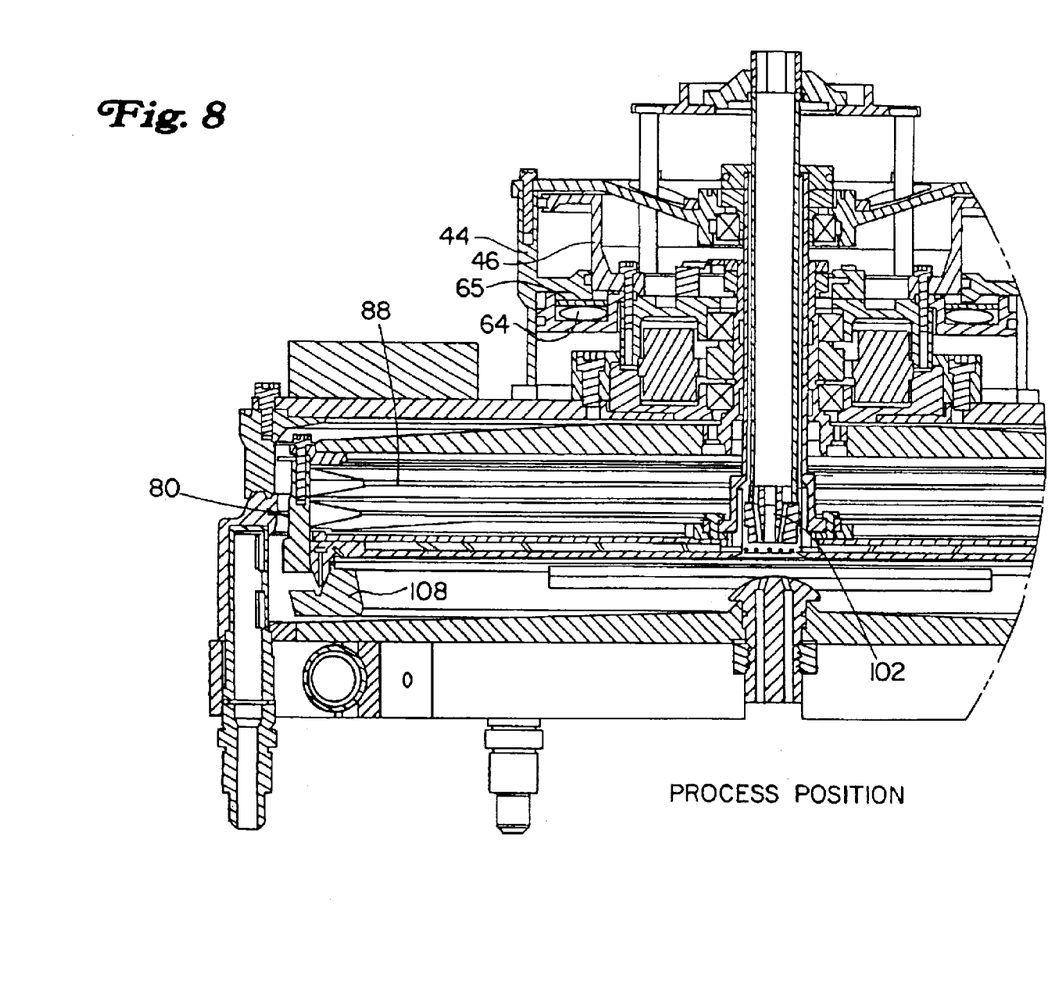
FIG. 8 is a partial section view of the reactor of FIG. 2 shown in a process position.

The reactor 22 then moves to the process position shown in FIG. 8. This occurs by providing compressed gas into the upper cylinder inlet 54. The gas pressure within the outer cylinder 44 drives the outer cylinder down. The outer cylinder 44 moves vertically but does not spin. This in turn drives the inner shaft 74 down. The bottom plate 86 and face plate 94 move down with the inner shaft 74, so that the face plate 94 engages the lower rotor 108. The bellows 88 extends to keep the head components enclosed as the face plate 94 moves away from the top plate 82 of the upper rotor assembly 80. The lower rotor 108, which is supported indirectly by the top plate 82, is vertically fixed in position and does not move.

As this occurs, the seal 104 seats into the groove 112, sealing the upper chamber 114, except at the outlets 106, as shown in FIG. 4. The workpiece is secured between the support pins on the face plate and the lower rotor. The support pins on the face plate and the lower rotor are dimensioned so that there is a small vertical clearance, typically about 0.005–0.015 or 0.008–0.012 inches between the pins and the workpiece. The workpiece is secured and held in place, although a small amount of vertical movement may occur. The workpiece is similarly secured radially with a small amount of clearance via the support pins just beyond the circumferential edges of the workpiece.

With the rotors in the closed or engaged position, the elevator 30 lowers the head 24 so that in engages with the base 26. The lip 41 on the head extends into the groove 124 on the base to help in alignment and avoid leakage. A process fluid may be provided via the line 72 and applied onto the top surface of the workpiece by the upper nozzle or opening 102. The fluid may be a liquid, a gas, or a vapor. The same or a different process fluid may be applied to the bottom surface of the workpiece via the lower nozzle 128. The motor 56 turns on and spins the inner shaft 74 and the outer shaft 76. This in turn spins the face plate 94 attached to the inner shaft 74 and the lower rotor 108 attached to the outer shaft. The spinning causes the fluid to flow outwardly over the workpiece. The upper surface of the workpiece in largely enclosed within the upper face chamber 114. Fluid on the upper and/or lower surfaces of the workpiece flows outwardly and fills the annular space 115 shown in FIG. 4. The seal 104 prevents fluid from escaping out from between the rotors. Thus, the fluid is confined to flowing out through the outlets 106. Fluid exiting the outlets 106 is flung off of the face plate against the inside surface of the base ring and flows down into the bowl 126, where it is collected and/or drained off.

The plane or flat areas of the face plate are spaced apart from the workpiece by a very small distance, e.g., 0.005–0.03 or 0.05 inches. Consequently, the chamber 114 can be filled with only a small volume of fluid. This reduces consumption of process chemicals and water.

The lower rotor 108 is ring-shaped and open in the center. This allows the nozzle 102 to direct fluid up onto the lower surface of the workpiece. For immersion processing, the bowl may be filled with fluid, so that the bottom surface and optionally the top surface as well are in contact with, or immersed in the bath of fluid in the bowl. The rotors may spin or remain still during immersion, if used.

After a fluid treatment step is completed, generally virtually all fluid must be removed from the chamber 114, as well as from around the lower rotor. This is necessary to avoid having the used fluid mix with or contaminate the fluid used in the next subsequent step. To very quickly remove fluid, the head moves into the position shown in FIG. 9. Compressed gas is released from the upper cylinder inlet 54. A wavy spring 64 on the cylinder base 48 pushes the outer cylinder 44 up. This causes the outer cylinder 44 to lift up part way, to the position shown in FIG. 9. No gas pressure acts on the outer cylinder 44 at this time. A wear ring 65 is positioned between the spring 64 and the bottom of the piston ring 50, to reduce wear on the spring 64.

Figure 9:
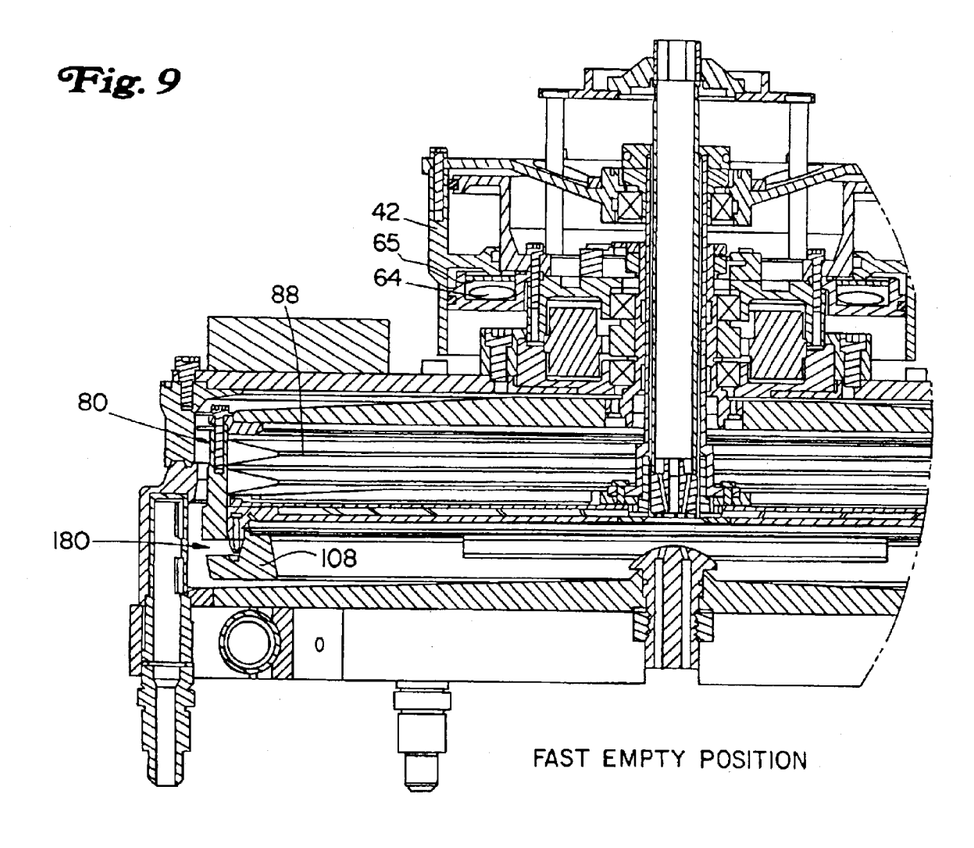
FIG. 9 is a partial section view of the reactor shown in FIG. 2 in a fast empty or drain position.

As the inner shaft 74 is connected to the outer cylinder 44 via the cylinder top plate 62 and the thrust bearing 75, the inner shaft is pulled up. As a result, the face plate 94 and bottom plate 86 are also shifted up. As shown in FIG. 9, the seal 104 moves up out of the slot 112, creating a fast drain annular opening 180. Fluid on or in the rotors rapidly flows out of the opening 180 under centrifugal force. The spinning of the rotors exerts a centrifugal force of e.g., 100–250 G which causes the fluid to quickly move out. This removes the fluid in less than 1, 2 or 3 seconds, and typically in less than 1 second. The nominal 0.005–0.015 vertical clearance between the workpiece and the support pins increases by about 0.010–0.030. Although there is more vertical clearance around the workpiece, it remains in place due to the support pins around the outside edges.

The head 24 can then be returned to the process position shown in FIG. 8 for additional processing, optionally with different fluids. Alternatively, the workpiece can be moved out of the system 20. This is achieved via the compressed gas supply, causing the outer cylinder 44 to move back up to the position shown in FIG. 7. The base 26 is preferably fixed in place and does not move. In the event of failure of the compressed gas supply, the spring 64 moves the head into the fast empty position shown in FIG. 9, where the workpiece remains secure.

Figure 10:
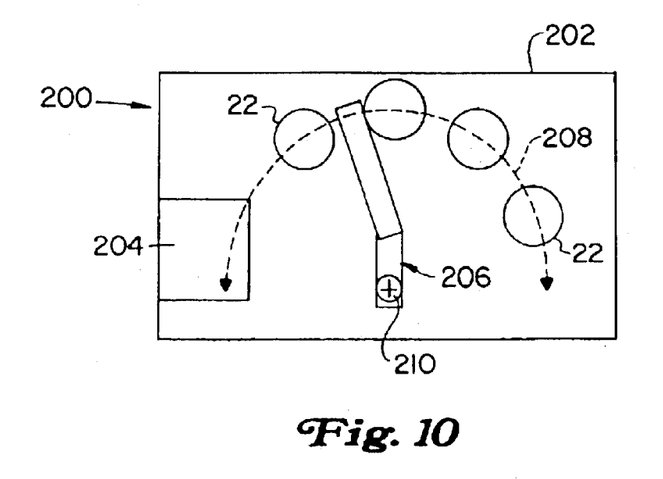
FIG. 10 is a schematic plan view of an automated system having an array of the reactors shown in FIGS. 1–9.
Figure 11:
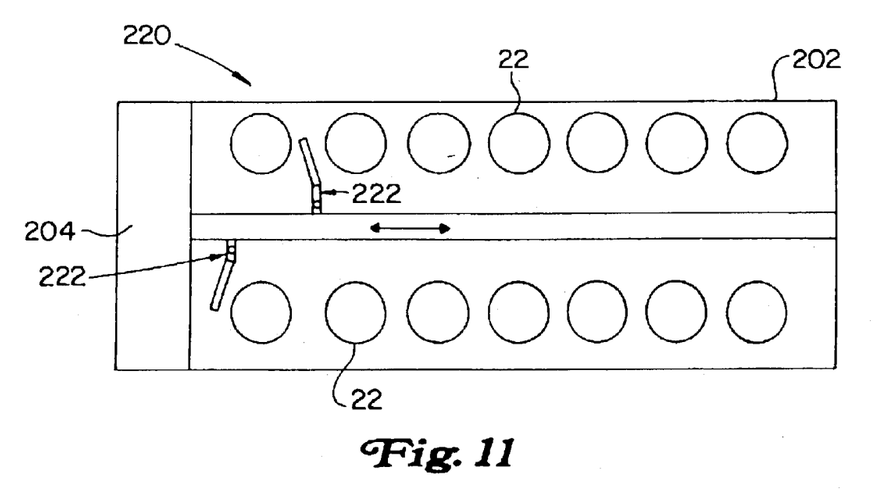
FIG. 11 is a schematic plan view of another automated system having an array of the reactors shown in FIGS. 1–9.

As shown in FIG. 10, an array of reactors 22 may be provided within an enclosure 202 of an apparatus 200. The reactors are arranged on an arc. Workpieces are moved into and out of the reactors from an input/output station 204 by a robot 206 at a central location 210. As shown in FIG. 10, in a similar apparatus 220, the reactors are arranged in columns. Workpieces are moved by robots 222 moving linearly.

The process head 24 spins the rotors and the workpiece in the direction RR shown in FIG. 5. During the liquid removal step of processing, liquid collects towards the bowl sidewall 132, as the base plate 122 tapers slightly downhill from the nozzle 128 towards the base ring 120. Accordingly, the depth of the bowl 126 is greater at the sidewall than at other locations within the bowl. The lower rotor 108 sweeps liquid along the sidewall 132 within the bowl 126. The liquid follows the expanding curvature of the sidewall in the contour section 134. The position and movement of the liquid at position K better facilitates movement of the liquid into the drain opening 150, to efficiently remove liquid from the bowl.

Referring to FIG. 3, the liquid moves into the bore section 148 and down into the flare section 144, and then into the manifold block 140. The valves in the manifold block are opened and closed to direct the liquid to an appropriate drain fitting and fluid line carrying the liquid away from the system 20. For example, when a process liquid being drained from the bowl 126 is to be re-circulated back into the bowl, the valves are offset so that liquid entering the manifold 140 is directed to a drain fitting leading to a recirculation line. Similarly, the other drain fittings are connected to lines leading to e.g., storage vessels, liquid waste treatment vessels, facility waste lines, etc.

After most or substantially all liquid has been removed from the bowl, compressed gas is released from the gas nozzles 146 in the outlet block 142, to help purge the drain opening 150 and passageways in the manifold block 140 of any remaining liquid.

Thus, novel process systems and methods have been shown and described. Of course, many changes, modifications and substitutions may be made, without departing from the spirit and scope of the invention. The invention, therefore, should not be limited, except by the following claims and their equivalents.

What is claimed is:

1. A system for processing a workpiece, comprising:
   a first rotor;
   a second rotor engageable with the first rotor;
   a fluid inlet in at least one of the first and second rotors for applying a liquid onto a workpiece between the first and second rotors;
   a drain manifold for draining liquid applied to the workpiece;
   a first valve in drain manifold and a first drain fitting associated with the first valve; and
   a second valve in the drain manifold and a second drain fitting associated with the second valve.

2. The system of claim 1 further comprising a third valve in the manifold associated with a third drain fitting.

3. The system of claim 2 further comprising a fourth drain valve in the manifold associated with a fourth drain fitting.

4. A system for processing a workpiece, comprising:
   a first rotor having a face plate;
   a ring-shaped second rotor;
   a shift assembly, for moving the first and second rotor together and apart; and
   a bowl, with the second rotor positionable in the bowl for processing.

5. The system of claim 4 further comprising a first rotor ring joined with the first rotor, with the second rotor supported on the first rotor ring, and with the shift assembly converting to the first rotor ring.

6. A system for processing a workpiece comprising:
   a first rotor;
   a second rotor engageable with the first rotor;
   an outlet in at least one of the first and second rotors;
   a load slot in the side of the first rotor, to allow loading and unloading of a workpiece into the system via horizontal movement of the workpiece.

7. The system of claim 6 further comprising first support pins on the first rotor and second support pins on the second rotor, with the second support pins vertically spaced apart from a workpiece in the system by about 0.005–0.015 inches, when the first and second rotors are brought together into a processing position.

8. The system of claim 6 wherein the first rotor is ring shaped and open in the center.

9. The system of claim 7 further comprising centering pins on at least one of the first and second rotors, outside of circumferential edges of a workpiece in the system, for maintaining the workpiece centered on a spin axis of the rotors.

10. The system of claim 7 further comprising movement means, for moving the first and second rotors towards and away from each other, and for spinning the rotors.

11. The system of claim 10 with the first rotor supported on the movement means.

12. The system of claim 11 further comprising an immersion vessel, and with the second rotor moveable into the immersion vessel via the movement means, for immersion processing at least one side of a workpiece.

13. The system of claim 12 with the immersion vessel having a sidewall including a contour section with an increasing radius of curvature.

14. The system of claim 13 with the sidewall of the contour section having a radius of curvature which increases from 5–15%.

* * * * *